United States Patent
Sakai et al.

(10) Patent No.: US 6,426,853 B1
(45) Date of Patent: Jul. 30, 2002

(54) MAGNETORESISTIVE EFFECT SENSOR, THIN-FILM MAGNETIC HEAD AND THIN-FILM WAFER WITH THE THIN-FILM MAGNETIC HEADS

(75) Inventors: Masanori Sakai; Ken-ichi Takano; Yuzuru Iwai, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/440,550

(22) Filed: Nov. 15, 1999

(30) Foreign Application Priority Data

Oct. 5, 1999 (JP) .......................................... 11-283868

(51) Int. Cl.[7] ................................................ G11B 5/39
(52) U.S. Cl. .............................. 360/324.11; 360/324.12
(58) Field of Search ........................ 360/324.11, 324.12

(56) References Cited

U.S. PATENT DOCUMENTS

| | | | |
|---|---|---|---|
| 4,956,736 A | * | 9/1990 | Smith ........................ 360/113 |
| 5,739,988 A | | 4/1998 | Gill |
| 6,178,071 B1 | * | 1/2001 | Hasegawa et al. ..... 360/324.11 |

FOREIGN PATENT DOCUMENTS

| | | | |
|---|---|---|---|
| JP | 53-022724 | * | 3/1978 |
| JP | 8-18120 | | 1/1996 |
| JP | 8-194920 | * | 7/1996 |
| JP | 8-235534 | | 9/1996 |

* cited by examiner

Primary Examiner—William Klimowicz
(74) Attorney, Agent, or Firm—Armstrong, Westerman & Hattori, LLP

(57) ABSTRACT

An MR sensor, a thin-film magnetic head and a thin-film wafer with a plurality of the thin-film magnetic heads having a MR multi-layered structure including a non-magnetic material layer, first and second ferromagnetic material layers (free and pinned layers) separated by the non-magnetic material layer, and an anti-ferromagnetic material layer formed adjacent to and in physical contact with one surface of the pinned layer, the one surface being on an opposite side of the pinned layer from the non-magnetic material layer, the multi-layered structure having ends in a direction parallel to a magnetically sensitive surface or an ABS, and longitudinal bias layers formed at both the ends of the MR multi-layered structure, for providing a longitudinal magnetic bias to the MR multi-layered structure. The MR multi-layered structure is shaped such that a magnetization direction of the pinned layer is inclined at an angle from an axis of easy magnetization of the pinned layer.

13 Claims, 5 Drawing Sheets

MAGNETORESISTIVE EFFECT SENSOR, THIN-FILM MAGNETIC HEAD AND THIN-FILM WAFER WITH THE THIN-FILM MAGNETIC HEADS

FIELD OF THE INVENTION

The present invention relates to a magnetoresistive effect (MR) sensor used for various magnetic detection, especially utilizing giant magnetoresistive effect (GMR) such as spin valve magnetoresistive effect (SVMR) or utilizing tunneling magnetoresistive effect (TMR), to a thin-film magnetic head used in a-magnetic record and/or reproduction device such as a HDD (Hard Disk Drive) unit, and to a thin-film wafer with a plurality of the thin-film magnetic heads.

DESCRIPTION OF THE RELATED ART

Recent growth rate of the recording density in magnetic recording is remarkable, for example, 100% of the average annual growth rate may be achieved. Increasing conversion efficiency in thin-film magnetic heads supports this growth in the recording density. A MR conversion rate of a thin-film magnetic head utilizing an anisotropic magnetoresistive effect (AMR) was merely about 2% at most. Whereas the MR conversion rate of a thin-film magnetic head with a SVMR sensor that is one of GMR sensors exhibiting high sensitivity and high power is 6–8%. This is about three times of that of the AMR head.

The SVMR head has a structure with first and second thin-film layers of a ferromagnetic material magnetically separated by a thin-film layer of non-magnetic metallic material, and a layer of anti-ferromagnetic material is formed in physical contact with the second ferromagnetic layer to provide exchange bias magnetic field by exchange coupling at the interface surface of the layers. The magnetization direction in the second ferromagnetic layer is constrained or maintained by the exchange coupling, hereinafter the second layer is called "pinned layer". On the other hand the magnetization direction of the first ferromagnetic layer is free to rotate in response to an externally applied magnetic field, hereinafter the first layer is called "free layers". The direction of the magnetization in the free layer changes between parallel and anti-parallel against the direction of the magnetization in the pinned layer, and hence the magnetoresistance greatly changes and GMR characteristics are obtained.

The output characteristic of the SVMR head depends upon the angular difference of magnetization between the free and pinned layers. The direction of the magnetization of the free layer is free to rotate in accordance with an external magnetic field. That of the pinned layer is theoretically fixed to a specific direction (called as "pinned directions") by the exchange coupling between this layer and adjacently formed anti-ferromagnetic layer.

During operation of the SVMR head, it is required that the magnetization direction in the free layer changes without accompanying domain wall movement. This is because the magnetization change accompanied by domain wall movement is non-reciprocal change and responds slower than that accompanied by no domain wall movement, and therefore produces a noise called as Barkhausen noise. Thus, in general, hard magnet layers are arranged at the both end portions of the SVMR structure, for providing bias magnetic field or longitudinal bias to the free layer so as to prevent domain wall movement from occurring.

In such SVMR head, if the magnetization direction in the pinned layer changes in accordance with some externally applied magnetic field, the magnetization direction in the free layer also changes under the influence of this magnetization direction change in the pinned layer so as to vary its output voltage. In fact, a composite type thin-film magnetic head with a SVMR sensor element and an inductive writing element tends to cause two state problems in which the output voltage of the head after writing operation takes two values. It is guessed that such two state problems are caused by change of the magnetization direction in the pinned layer due to applied writing magnetic field from the inductive element.

Since the magnetization direction in the free layer is not completely in parallel with the surface of the magnetic recording medium but inclines toward the magnetic recording medium, the asymmetry characteristics of the SVMR head when it is off-tracked is greatly shifted to the negative side. This inclination is especially large at the track edge regions. If the asymmetry characteristics shifts to the negative side greatly, servo control for controlling the position of the SVMR head to the track center by servo signals recorded on the magnetic recording medium cannot be accurately carried out.

SUMMARY OF THE INVENTION

It is therefore an object of the present invention to provide a MR sensor, a thin-film magnetic head and a thin-film wafer with the thin-film magnetic heads, whereby instability of output characteristics such as two state problems can be resolved.

Another object of the present invention is to provide a MR sensor, a thin-film magnetic head and a thin-film wafer with the thin-film magnetic heads, whereby improved asymmetry characteristics can be expected.

According to the present invention, a MR sensor, a thin-film magnetic head and a thin-film wafer with a plurality of the thin-film magnetic heads has a MR multi-layered structure including a non-magnetic material layer, first and second ferromagnetic material layers (free and pinned layers) separated by the non-magnetic material layer, and an anti-ferromagnetic material layer formed adjacent to and in physical contact with one surface of the pinned layer, the one surface being in opposite side of the non-magnetic material layer, the multi-layered structure having ends in a direction parallel to a magnetically sensitive surface or an air bearing surface (ABS), and longitudinal bias means formed at both the ends of the MR multi-layered structure, for providing a longitudinal magnetic bias to the MR multi-layered structure. Particularly, according to the present invention, the MR multi-layered structure is shaped such that a magnetization direction of the pinned layer is inclined an angle from an axis of easy magnetization of the pinned layer.

Since the magnetization direction of the pinned layer forms an angle with respect to the easy axis of the pinned layer, the magnetization direction of the pinned layer becomes easy to return even if external magnetic field is applied thereto. Therefore, instability of output characteristics such as two state problems that will be induced by applied external magnetic field, for example writing magnetic field, can be effectively resolved.

It is preferred that the magnetization direction of the pinned layer is inclined an angle toward a direction opposite to or the same direction as a direction of the longitudinal magnetic bias from the easy axis of the pinned layer.

If the magnetization direction of the pinned layer is inclined an angle of larger than 0 degree from the easy axis of this pinned layer, improved stability of output characteristics may be obtained. In fact, this angle is preferably determined to an angle of equal to or larger than 2 degrees, more preferably to an angle of equal to or larger than 5 degrees. If this angle is too large, the output voltage will decrease. Thus it is preferred that this angle is determined to an angle of equal to or smaller than 60 degrees.

According to the present invention, furthermore, a MR sensor, a thin-film magnetic head and a thin-film wafer with a plurality of the thin-film magnetic heads in which interface surfaces between the MR multi-layered structure of GMR or TMR and the longitudinal bias means are inclined an angle from a direction perpendicular to the magnetically sensitive surface or the ABS. In other words, the end faces in the track-width direction, of the MR multi-layered structure are not perpendicular to the ABS or the magnetically sensitive surface but inclined the angle toward the longitudinal bias means or the track-width direction in case of a magnetic head. Since the end faces of the MR multi-layered structure are inclined, the end faces of the pinned layer also inclined.

Thus, the shape anisotropy of the pinned layer due to the inclination of its end faces and the layer anisotropy of the pinned layer itself of are making an angle, the magnetization direction of the pinned layer becomes easy to return even if external magnetic field is applied thereto. As a result, instability of output characteristics such as two state problems that will be induced by applied external magnetic field, for example writing magnetic field, can be effectively resolved.

Furthermore, the end faces of the MR multi-layered structure are inclined, deviation of the asymmetry characteristics from its center becomes small and as a result correct and accurate servo control can be obtained.

Japanese Unexamined Patent Publication No.8(1996)-18120 discloses a MR element with inclined end edges for controlling the magnetic domain of the MR element into a single domain structure without applying any longitudinal bias. Thus, this conventional art quite differs in objects and in constitutions, as well as operations and advantages from these of the present invention.

Japanese Unexamined Patent Publication No.8(1996)-235534 discloses a thin-film AMR head with a MR layer which includes one outer edge inclined by an obtuse angle with respect to its under edge so as to resolve problems of right and left asymmetry in its off-track sensitivity. Such asymmetrical off-track sensitivity is caused by inclined magnetization of the MR layer in the AMR head turned by 45 degrees against the ABS. In case of the AMR head, since the magnetic field applied from the magnetic recording medium and passing through the MR layer orients perpendicular to the above-mentioned magnetization direction, the off-track sensitivity of the MR layer differs between its right side and left side. Therefore, this conventional art intends to resolve the problems of asymmetrical off-track sensitivity in the MR layer of the AMR head.

As is well known, the theory of operations of GMR and TMR heads and also the magnetization in the GMR and TMR elements themselves completely differ from these of the AMR head. Especially, in the GMR or TMR multi-layered structure of the GMR or TMR head as the magnetic head according to the present invention, since the magnetization direction of the free layer is almost parallel to the ABS, no asymmetrical sensitivity distribution like the AMR head is produced. Thus, problems to be solved by the present invention is quite different from that of the conventional art described in Japanese Unexamined Patent Publication No.8 (1996)-235534. According to the present invention, in order to obtain magnetic stabilization in the pinned layer, the GMR or TMR multi-layered structure is configured so as to incline the magnetization direction of the pinned layer to its easy axis. Thus, this conventional art quite differs in objects and in constitutions, as well as operations and advantages from these of the present invention.

U.S. Pat. No. 5,739,988 discloses a GMR head with lead conductors inclined by 45 degrees in order to obtain the AMR effect in addition to the GMR effect. However, in this conventional art, only the lead conductors are inclined, and therefore this conventional art quite differs in objects and in constitutions, as well as operations and advantages from these of the present invention.

It is preferred that the interface surfaces are inclined an angle toward a direction opposite to or the same direction as a direction of the longitudinal magnetic bias from a direction perpendicular to the ABS or the magnetically sensitive surface.

If the interface surfaces are inclined an angle of larger than 0 degree from the direction perpendicular to the ABS or the magnetically sensitive surface, improved stability of output characteristics may be obtained. In fact, this angle is preferably determined to an angle of equal to or larger than 2 degrees, more preferably to an angle of equal to or larger than 5 degrees. If this angle is too large, the output voltage will decrease. Thus it is preferred that this angle is determined to an angle of equal to or smaller than 60 degrees.

Further objects and advantages of the present invention will be apparent from the following description of the preferred embodiments of the invention as illustrated in the accompanying drawings.

DESCRIPTION OF THE PREFERRED EMBODIMENTS

Figure 1:
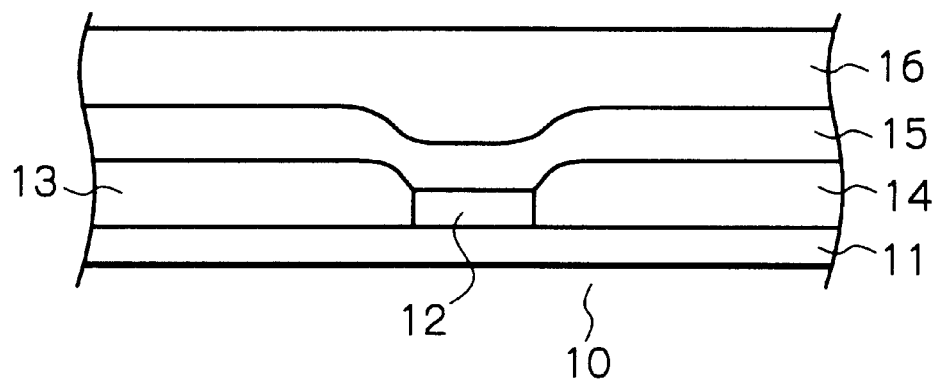
FIG. 1 shows a sectional view seen from the ABS, schematically illustrating a SVMR sensor of a thin-film magnetic head as a preferred embodiment according to the present invention.
Figure 2:
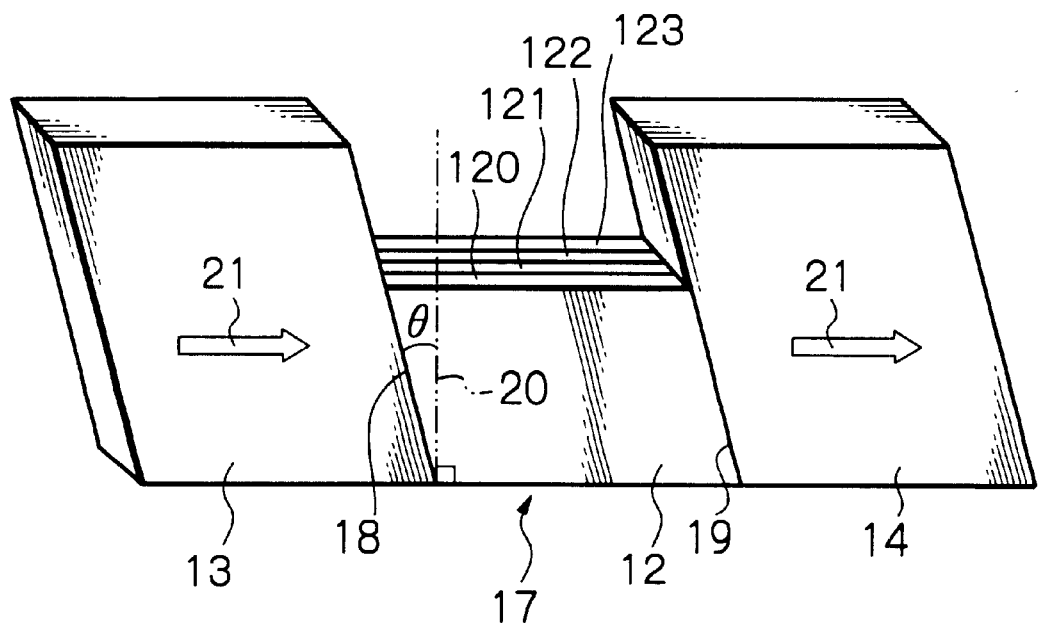
FIG. 2 shows an oblique view illustrating fundamental configuration of a SVMR multi-layered structure and hard magnetic layers for providing longitudinal bias in this embodiment.

FIG. 1 schematically illustrates a SVMR sensor of a thin-film magnetic head as a preferred embodiment according to the present invention, and FIG. 2 illustrates fundamental configuration of a SVMR multi-layered structure and hard magnetic layers for providing longitudinal bias in this embodiment.

Referring to FIG. 1, reference numeral 10 denotes a lower shield layer, 11 a lower shield gap layer deposited on the lower shield layer 10, 12 the SVMR multi-layered structure formed on the lower shield gap layer 11, 13 and 14 hard magnetic layers formed to contact with both end faces in a direction parallel to the ABS, of the SVMR multi-layered structure 12, so as to provide the longitudinal bias for controlling the magnetic domain to the SVMR multi-layered structure 12 to one direction, 15 an upper shield gap layer formed on the SVMR multi-layered structure 12 and the hard magnetic layers 13 and 14, and 16 an upper shield layer deposited on the upper shield gap layer 15, respectively.

As shown in FIG. 2, the SVMR multi-layered structure 12 has first and second ferromagnetic thin-film layers 120 and 121, and a thin-film layer 121 of a non-magnetic electrically conductive material for magnetically separating the first and second ferromagnetic thin-film layers 120 and 121 to form a sandwiched configuration. On the second ferromagnetic thin-film layer 122, a thin-film layer 123 of anti-ferromagnetic material is stacked, and a magnetic field generated by the exchange coupling at the interface surface of the thin-film layers 122 and 123 magnetizes the ferromagnetic layer 122, and so to speak the layer is pinned. Thus, the second ferromagnetic layer 122 is called as a pinned layer. The first ferromagnetic thin-film layer 120 is a free layer in which there is no effect of exchange coupling and hence the magnetization is free to rotate in response to an externally applied magnetic field. In FIG. 2, furthermore, reference numerals 17 denotes the ABS, and 18 and 19 interface surfaces between the SVMR multi-layered structure 12 and the hard magnetic layers 13 and 14, respectively.

As will be apparent from FIG. 2, the interface surfaces 18 and 19 between the SVMR multi-layered structure 12 and the hard magnetic layers 13 and 14 are inclined an angle θ from the direction 20 perpendicular to the ABS 17. In other words, the end faces in the track-width direction, of the SVMR multi-layered structure 12 are not perpendicular to the ABS 17 but inclined the angle θ toward the track-width direction. Especially, in this embodiment, the interface surfaces 18 and 19 are inclined the angle θ toward the opposite direction of a direction 21 of the longitudinal bias from the direction 20 perpendicular to the ABS 17. The angle θ is larger than 0 degree to somewhat obtain the effect of output stability. However, in fact, the angle θ is preferably equal to or larger than 2 degrees, more preferably equal to or larger than 5 degrees and also preferably equal to or smaller than 60 degrees.

Figure 3:
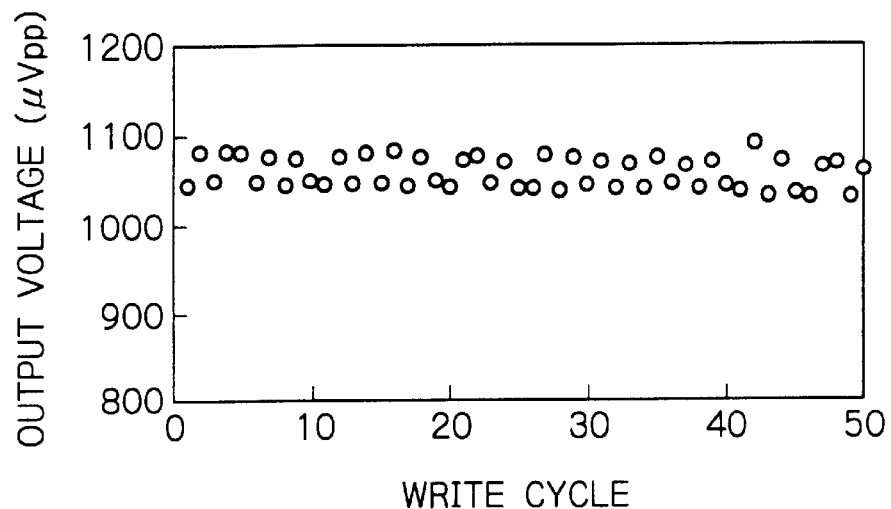
FIG. 3 illustrates experimentally obtained characteristics of peak output voltage versus write cycle of a conventional SVMR sensor.
Figure 4:
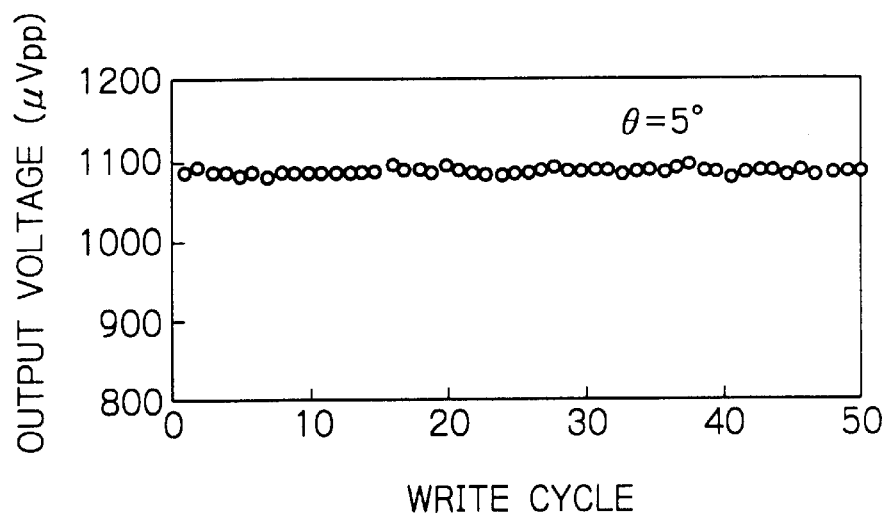
FIG. 4 illustrates experimentally obtained characteristics of peak output voltage versus write cycle of the SVMR sensor of the embodiment shown in FIGS. 1 and 2.
Figure 5:
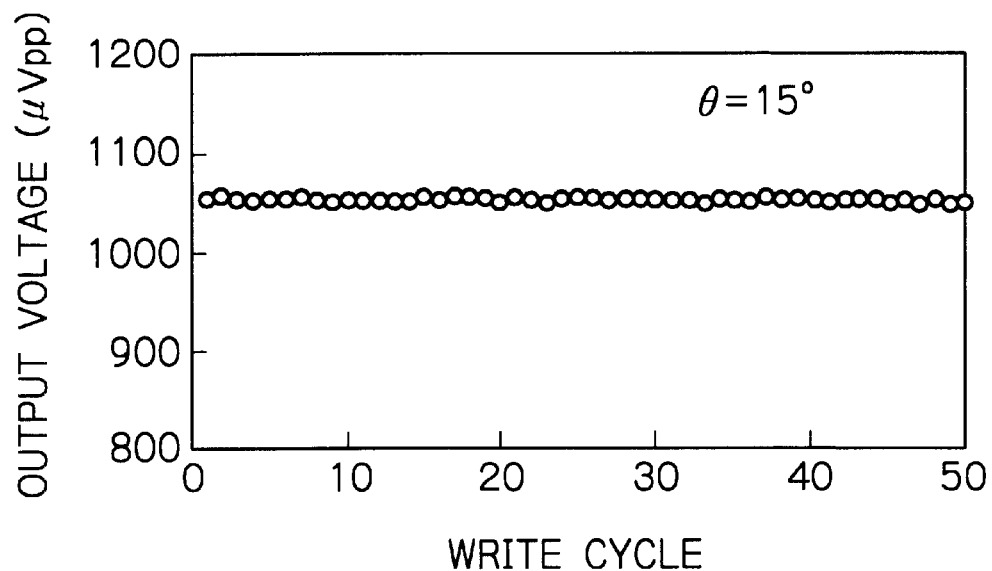
FIG. 5 illustrates experimentally obtained characteristics of peak output voltage versus write cycle of the SVMR sensor of the embodiment shown in FIGS. 1 and 2.
Figure 6:
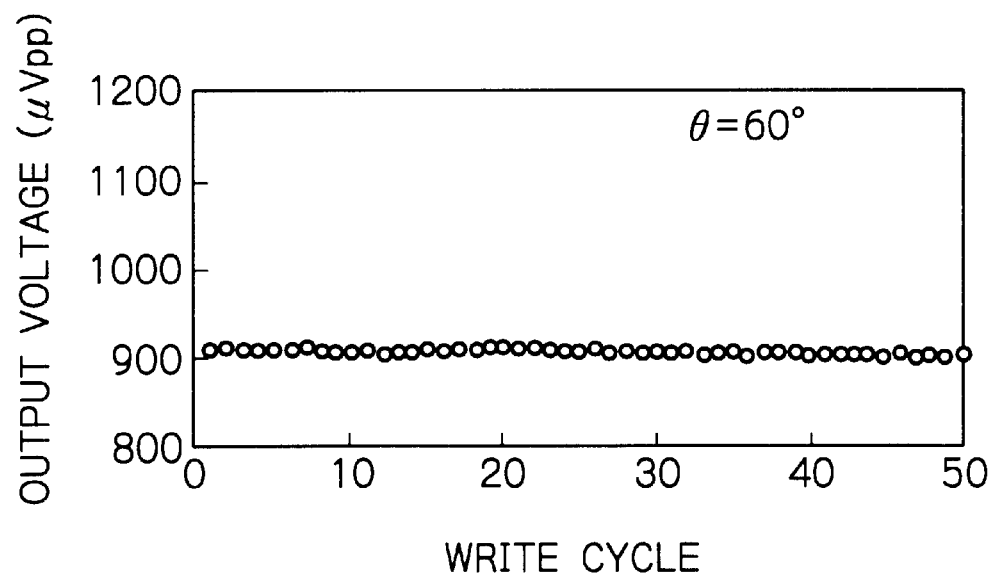
FIG. 6 illustrates experimentally obtained characteristics of peak output voltage versus write cycle of the SVMR sensor of the embodiment shown in FIGS. 1 and 2.
Figure 7:
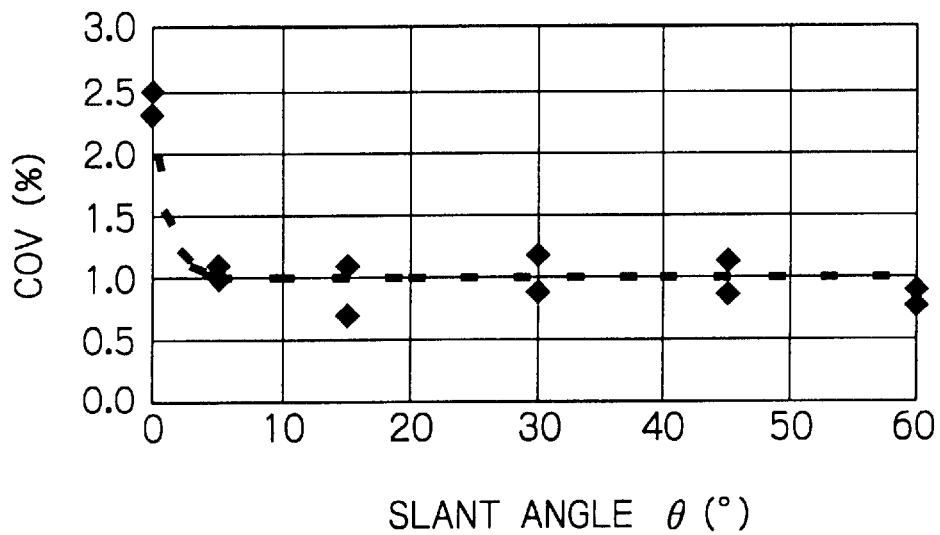
FIG. 7 illustrates experimentally obtained characteristics of output voltage stability versus slant angle θ of the SVMR sensor of the embodiment shown in FIGS. 1 and 2.

FIG. 3 illustrates experimentally obtained characteristics of peak output voltage versus write cycle of a conventional SVMR sensor, and FIGS. 4 to 6 illustrate characteristics of peak output voltage versus write cycle of the SVMR sensor of this embodiment, obtained by experiments. FIG. 7 illustrates characteristics of output voltage stability COV versus slant angle θ including the result of the experiments of FIGS. 4 to 6.

The writing operations in these experiments were executed by alternating the polarity of the last bit of writing data at each write cycle between positive and negative. The experiment data of FIG. 4 is in case of θ=5 degrees, the experiment data of FIG. 5 is in case of θ=15 degrees, and the experiment data of FIG. 6 is in case of θ=60 degrees.

The output voltage stability COV (%) is given from the following equation:

$$COV = \sigma/mean \times 100$$

where mean and σ are an average value and a standard deviation of output voltages of the SVMR head measured by 100 times between which other operation such as writing operation is inserted in. The smaller the COV, the higher the stability of the head.

According to the composite type thin-film magnetic head with the conventional SVMR sensor and the inductive write element, the magnetization direction in the pinned layer changes in accordance with the writing magnetic field, and then the magnetization direction in the free layer changes under the influence of this magnetization direction change in the pinned layer. Thus, as shown in FIG. 3, the output voltage after the writing operation may take two values, namely two state problems may occur.

Whereas, if the interface surfaces 18 and 19 are inclined by θ=15 degrees as this embodiment, fluctuations in output voltage called two state problems are almost prevented from occurring as shown in FIG. 5. This is guessed that, since the shape anisotropy of the pinned layer due to the inclination of the interface surfaces 18 and 19 and the layer anisotropy of the pinned layer itself of are making an angle, the magnetization direction of the pinned layer becomes easy to return even if external magnetic field is applied thereto, in other words the ease of change in the magnetization in the pinned layer is restricted.

As will be noted from FIG. 7, if the slant angle θ of the interface surfaces 18 and 19 is larger than 0 degree, some effect of output stability will be obtained. The output stability COV required for such thin-film magnetic head is in general 2% or less. It is apparent from the figure, this requirement will be satisfied if the slant angle θ is equal to 2 degrees. In fact, the slant angle θ is preferably equal to or larger than 2 degrees, more preferably equal to or larger than 5 degrees.

As shown in FIG. 6, if the slant angle θ greatly increases, the output voltage itself reduces. Thus, it is desired that the slant angle θ is equal to or smaller than 60 degrees.

Figure 8A:
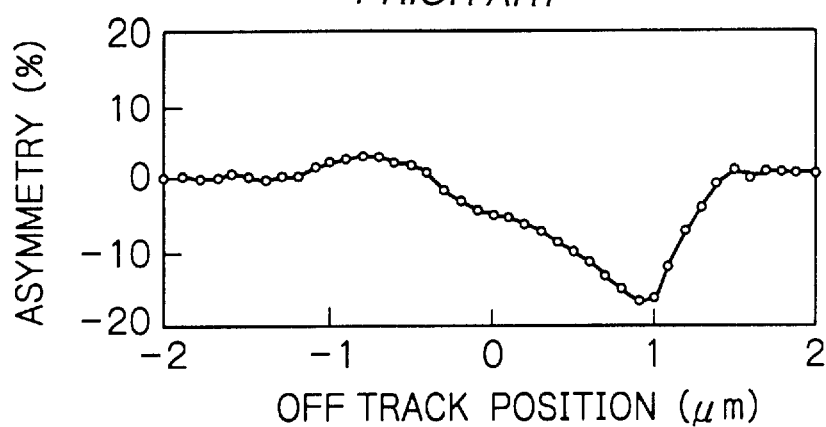
FIGS. 8a and 8b illustrate experimentally obtained characteristics of asymmetry versus off-track position of a conventional SVMR sensor.
Figure 8B:
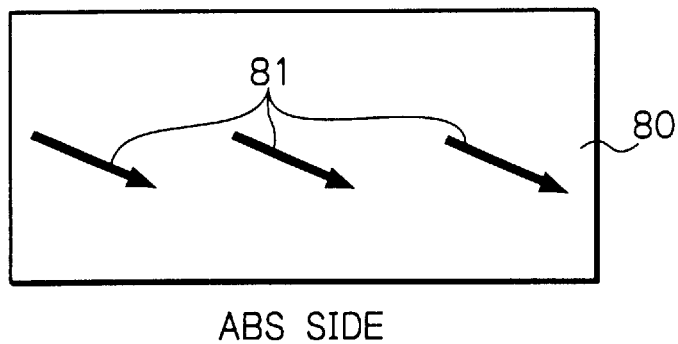
Figure 9A:
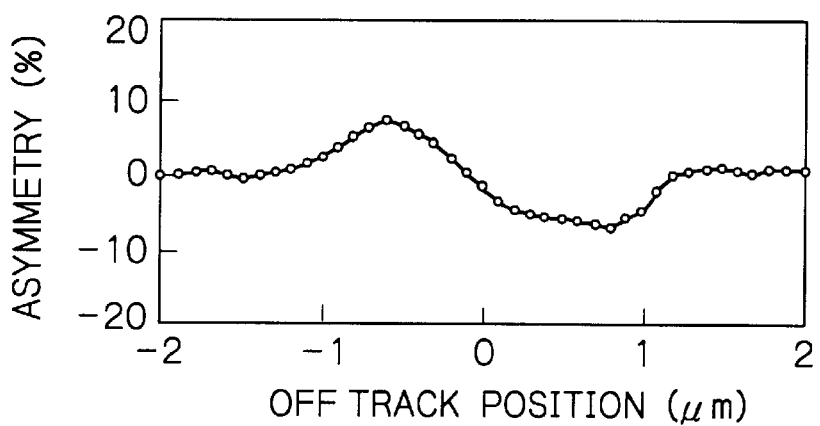
FIGS. 9a and 9b illustrate experimentally obtained characteristics of asymmetry versus off-track position of the embodiment shown in FIGS. 1 and 2.
Figure 9B:
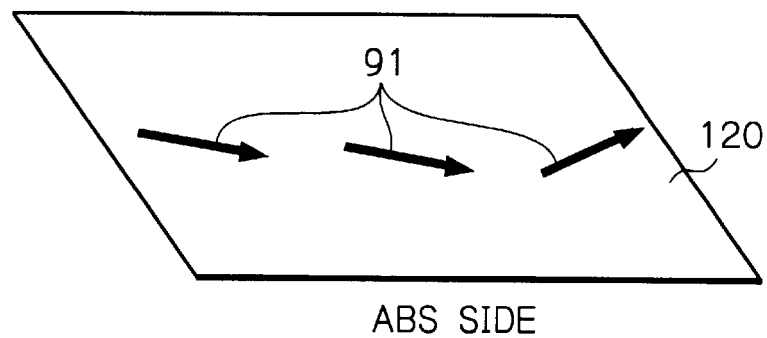

FIGS. 8a and 8b illustrate experimentally obtained characteristics of asymmetry versus off-track position of a conventional SVMR sensor, and FIGS. 9a and 9b illustrate experimentally obtained characteristics of asymmetry versus off-track position of this embodiment. The experiment data shown in FIG. 9a are in case of the slant angle θ=15 degrees.

As mentioned before, since the conventional SVMR sensor has a structure that the magnetic field from the pinned layer perpendicular to the magnetic recording medium is applied to the free layer, the operation point of the sensor namely of the free layer deviates depending upon this magnetic field applied from the pinned layer. Thus, as shown in FIG. 8a, the asymmetry characteristics of the conventional SVMR head when it is off-tracked is greatly shifted to the negative side. If the asymmetry characteristics shifts to the negative side greatly, correct servo control for controlling the position of the SVMR head to the track center by servo signals recorded on the magnetic recording medium cannot be expected. It can be supposed from the asymmetry characteristics of FIG. 8a that the magnetization direction 81 in the free layer 80 of the conventional SVMR sensor is not completely in parallel with the ABS or the surface of the magnetic recording medium but inclined toward this magnetic recording medium as shown in FIG. 8b.

Contrary to this, if the interface surfaces 18 and 19 are inclined as this embodiment, deviation of the asymmetry from its center when the SVMR head is off-tracked becomes small as shown in FIG. 9a and thus excellent asymmetry characteristics can be obtained. It can be supposed from the asymmetry characteristics of FIG. 9a that the magnetization direction 91 in the right side region in the drawing (region of the hard magnet 14 side) of the free layer 120 of the SVMR sensor is inclined toward the opposite side of the ABS or the magnetic recording medium (opposite side as that in FIG. 8b) as shown in FIG. 9b. The excellent asymmetry characteristics results correct and accurate servo control.

According to the invention, the constitution of the SVMR multi-layered structure 12 is not limited to a specific embodiment. Each layer of the structure can be made of any material with necessary function. For example, the anti-ferromagnetic material layer 123 can be made of PtMn, NiMn or IrMn, the second ferromagnetic material layer (pinned layer) 122 can be made of Co, FeCo or NiFe, the non-magnetic metallic material layer 121 can be made of Cu, Ag or Au, and the first ferromagnetic material layer (free layer) 120 can be made of FeCo, NiCo or FeCoNi. The hard magnet layers 13 and 14 can be made of CoPt, CoCrPt or SmCo. The SVMR multi-layered structure 12 can additionally include a seed or under layer, an electron reflection layer, a bias cancellation layer and/or a protection layer. Furthermore, the stacking order of each layer of the structure can be inverted as from the substrate the anti-ferromagnetic material layer, the second ferromagnetic material layer (pinned layer), the non-magnetic metallic material layer and the first ferromagnetic material layer (free layer).

In modification, the longitudinal bias can be provided from a multi-layered structure of an anti-ferromagnetic material layer and a ferromagnetic material layer instead of the hard magnet layer.

In the aforementioned specific embodiment, AlTiC is used for the substrate, two layered structure of NiFe/Co is used for the first ferromagnetic material layer (free layer) 120, Cu is used for the non-magnetic metallic material layer 121, Co is used for the second ferromagnetic material layer (pinned layer) 122, and FeMn is used for the anti-ferromagnetic material layer 123.

To fabricate the SVMR multi-layered structure 12, an under seed layer of $Al_2O_3$, a lower shield layer of FeAlSi and a lower gap layer of $Al_2O_3$ are deposited on an AlTiC substrate (wafer), and thereafter, a seed layer of Ta with 5 nm thickness, ferromagnetic material layers of NiFe with 9 nm thickness and Co with 1 nm thickness which constitute the free layer 120, a non-magnetic metallic material layer 121 of Cu with 2.5 nm thickness, a ferromagnetic material layer of Co with 2.5 nm thickness which constitutes the pinned layer 122, an anti-ferromagnetic material layer 123 of FeMn with 10 nm thickness and a protection layer of Ta with 5 nm thickness are sequentially deposited by RF sputtering.

Then, a patterned resist layer with slant portions which correspond to the end faces in the track-width direction of the SVMR multi-layered structure 12 and are inclined the angle θ from the direction perpendicular to the ABS is formed. Thereafter, by using this patterned resist layer, ion milling is executed to make the SVMR multi-layered structure 12 with thus inclined end faces at the track-width direction.

Then, a seed layer of TiW with 10 nm thickness, magnet layers 13 and 14 of CoPt with 50 nm thickness and lead conductor layers of Ta with 50 nm thickness are stacked. Thereafter, an upper gap layer of $Al_2O_3$ and an upper shield layer of NiFe are stacked. Thus, on the wafer, many SVMR sensors are formed.

Then, required annealing processes for thus fabricated wafer to magnetize the free layer 120 and the pinned layer 122 of each SVMR sensor in directions orthogonal to each other are executed.

Figure 10:
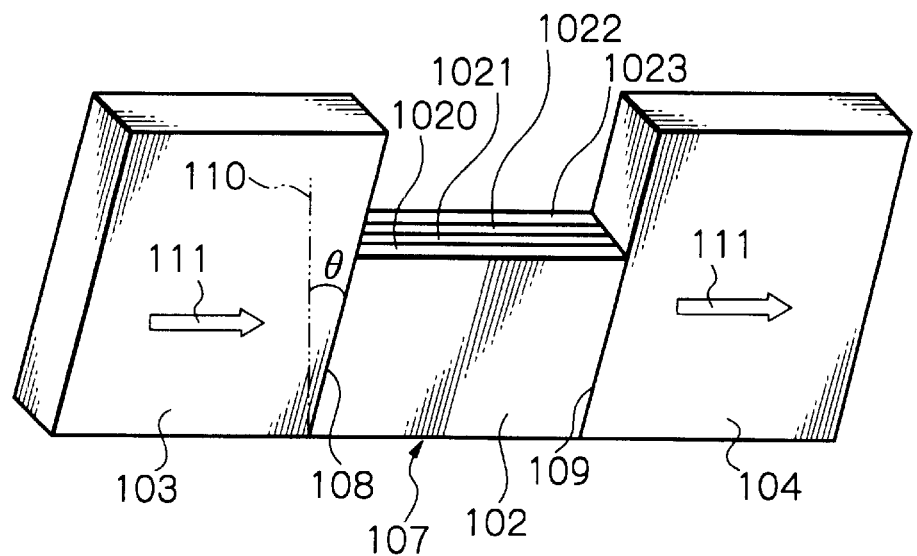
FIG. 10 shows an oblique view of fundamental configuration of a SVMR multi-layered structure and hard magnetic layers for providing longitudinal bias in another embodiment according to the present invention.

FIG. 10 illustrates fundamental configuration of a SVMR multi-layered structure and hard magnetic layers for providing longitudinal bias in another embodiment according to the present invention.

As shown in FIG. 10, a SVMR multi-layered structure 102 in this embodiment has first and second ferromagnetic thin-film layers 1020 and 1021, and a thin-film layer 1021 of a non-magnetic electrically conductive material for magnetically separating the first and second ferromagnetic thin-film layers 1020 and 1021 to form a sandwiched configuration. On the second ferromagnetic thin-film layer 1022, a thin-film layer 1023 of anti-ferromagnetic material is stacked, and a magnetic field generated by the exchange coupling at the interface surface of the thin-film layers 1022 and 1023 magnetizes the ferromagnetic layer 1022, and so to speak the layer is pinned. Thus, the second ferromagnetic layer 1022 is called as a pinned layer. The first ferromagnetic thin-film layer 1020 is a free layer in which there is no effect of exchange coupling and hence the magnetization is free to rotate in response to an externally applied magnetic field. In FIG. 10, furthermore, reference numerals 107 denotes the ABS, and 108 and 109 interface surfaces between the SVMR multi-layered structure 102 and hard magnetic layers 103 and 104, respectively.

As will be apparent from FIG. 10, the interface surfaces 108 and 109 between the SVMR multi-layered structure 102 and the hard magnetic layers 103 and 104 are inclined an angle θ (5 degrees θ 60 degrees) from the direction 110 perpendicular to the ABS 107. In other words, the end faces in the track-width direction, of the SVMR multi-layered structure 102 are not perpendicular to the ABS 107 but inclined the angle θ toward the track-width direction. Especially, in this embodiment, the interface surfaces 108 and 109 are inclined the angle θ toward the same direction of a direction 111 of the longitudinal bias from the direction 110 perpendicular to the ABS 107.

Another constitutions and modifications in this embodiment are the same as these in the embodiment of FIGS. 1 and 2.

This embodiment can solve instability of output characteristics such as two state problems as well as the embodiment of FIGS. 1 and 2. Although asymmetry characteristics in this embodiment somewhat deviates in comparison with that in the embodiment of FIGS. 1 and 2, such deviation can be compensated by an additional appropriate electrical circuit.

In the aforementioned embodiments, both interface surfaces between the SVMR multi-layered structure and hard magnetic layers are inclined from the perpendicular direction to the ABS. If only one of the interface surfaces between the SVMR multi-layered structure and hard magnetic layers is inclined, a certain amount of the aforementioned effect can be obtained. However, in this case, there is a problem that the recording track width may change depending upon the machined amount of throat height or MR height.

Furthermore, although the present invention is described by using the SVMR sensor in the aforementioned embodiments, the present invention is of course applicable to another GMR sensors and to TMR sensors.

As will be understood from the above-description, according to the present invention, the interface surfaces between the MR multi-layered structure of GMR or TMR and the longitudinal bias providing means are inclined an angle from the direction perpendicular to the ABS or the magnetically sensitive surface. In other words, the end faces in the track-width direction, of the MR multi-layered structure are not perpendicular to the ABS or the magnetically sensitive surface but inclined the angle toward the longitudinal bias providing means or the track-width direction in case of a magnetic head. Since the end faces of the MR multi-layered structure are inclined, the end faces of the pinned layer also inclined. Thus, the shape anisotropy of the pinned layer due to the inclination of its end faces and the layer anisotropy of the pinned layer itself of are making an angle, the magnetization direction of the pinned layer becomes easy to return even if external magnetic field is applied thereto. As a result, instability of output characteristics such as two state problems that will be induced by applied external magnetic field such as writing magnetic field can be effectively resolved. Furthermore, the end faces of the MR multi-layered structure are inclined, deviation of the asymmetry characteristics from its center becomes small and as a result correct and accurate servo control can be obtained.

Many widely different embodiments of the present invention may be constructed without departing from the spirit and scope of the present invention. It should be understood that the present invention is not limited to the specific embodiments described in the specification, except as defined in the appended claims.

What is claimed is:

1. A magnetoresistive effect sensor with a magnetic detection surface to which a magnetic field to be sensed is applied comprising:

a magnetoresistive effect multi-layered structure including a non-magnetic material layer, first and second ferromagnetic material layers separated by said non-magnetic material layer, and an anti-ferromagnetic material layer formed adjacent to and in physical contact with one surface of said second ferromagnetic material layer, said one surface being on an opposite side of said second ferromagnetic material layer from said non-magnetic material layer, said multi-layered structure having ends located in a direction parallel to said magnetic detection surface; and longitudinal bias means formed at both said ends of said magnetoresistive effect multi-layered structure, for providing a longitudinal magnetic bias to said magnetoresistive effect multi-layered structure, interface surfaces between said magnetoresistive effect multi-layered structure and said longitudinal bias means, said interface surfaces being inclined from a direction perpendicular to said magnetic detection surface.

2. The sensor as claimed in claim 1, wherein said interface surfaces are inclined toward a direction opposite to a direction of said longitudinal magnetic bias from the direction perpendicular to said magnetic detection surface.

3. The sensor as claimed in claim 1, wherein said interface surfaces are inclined toward the same direction as a direction of said longitudinal magnetic bias from the direction perpendicular to said magnetic detection surface.

4. The sensor as claimed in claim 1, wherein said interface surfaces are inclined at an angle equal to or greater than 2 degrees from the direction perpendicular to said magnetic detection surface.

5. The sensor as claimed in claim 1, wherein said interface surfaces are inclined at an angle equal to or greater than 5 degrees from the direction perpendicular to said magnetic detection surface.

6. The sensor as claimed in claim 1, wherein said interface surfaces are inclined at an angle equal to or less than 60 degrees from the direction perpendicular to said magnetic detection surface.

7. A thin-film magnetic head with an air bearing surface comprising:

a magnetoresistive effect multi-layered structure including a non-magnetic material layer, first and second ferromagnetic material layers separated by said non-magnetic material layer, and an anti-ferromagnetic material layer formed adjacent to and in physical contact with one surface of said second ferromagnetic material layer, said one surface being on an opposite side of said second ferromagnetic material layer from said non-magnetic material layer, said multi-layered structure having ends located in a track width direction;

longitudinal bias means formed at both said ends of said magnetoresistive effect multi-layered structure, for providing a longitudinal magnetic bias to said magnetoresistive effect multi-layered structure; and interface surfaces between said magnetoresistive effect multi-layered structure and said longitudinal bias means, said interface surfaces being inclined from a direction perpendicular to said air bearing surface.

8. The head as claimed in claim 7, wherein said interface surfaces are inclined toward a direction opposite to a direction of said longitudinal magnetic bias from the direction perpendicular to said air bearing surface.

9. The head as claimed in claim 7, wherein said interface surfaces are inclined toward the same direction as a direction of said longitudinal magnetic bias from the direction perpendicular to said air bearing surface.

10. The head as claimed in claim 7, wherein said interface surfaces are inclined at an angle equal to or greater than 2 degrees from the direction perpendicular to said air bearing surface.

11. The head as claimed in claim 7, wherein said interface surfaces are inclined at an angle equal to or greater than 5 degrees from the direction perpendicular to said air bearing surface.

12. The head as claimed in claim 7, wherein said interface surfaces are inclined at an angle equal to or less than 60 degrees from the direction perpendicular to said air bearing surface.

13. A thin-film wafer provided with a plurality of the thin-film magnetic heads claimed in claim 7.

* * * * *